(12) United States Patent
Kwon et al.

(10) Patent No.: US 7,358,810 B2
(45) Date of Patent: Apr. 15, 2008

(54) BUFFER AMPLIFIER

(75) Inventors: Ick-jin Kwon, Yongin-si (KR);
Seong-sik Song, Daejeon (KR);
Yun-seong Eo, Suwon-si (KR);
Heung-bae Lee, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 126 days.

(21) Appl. No.: 11/438,222

(22) Filed: May 23, 2006

(65) Prior Publication Data
US 2007/0001760 A1    Jan. 4, 2007

(30) Foreign Application Priority Data
Jul. 1, 2005    (KR) ............... 10-2005-0059150

(51) Int. Cl.
*H03F 3/45* (2006.01)
(52) U.S. Cl. ............................ 330/253; 330/260
(58) Field of Classification Search ........... 330/253, 330/260
See application file for complete search history.

(56) References Cited

U.S. PATENT DOCUMENTS

| 5,012,137 | A | * | 4/1991 | Muellner ............ 326/66 |
| 5,491,441 | A | | 2/1996 | Goetschel et al. |
| 6,020,789 | A | | 2/2000 | Wang |
| 6,788,142 | B2 | * | 9/2004 | Li et al. ............ 330/253 |
| 2007/0253128 | A1 | * | 11/2007 | Tiebout et al. ............ 361/56 |

* cited by examiner

*Primary Examiner*—Steven J. Mottola
(74) *Attorney, Agent, or Firm*—Sughrue Mion, PLLC

(57) ABSTRACT

A buffer amplifier, which includes a first differential signal amplifier including first and second NMOSFETs (N-type metal-oxide semiconductor field-effect transistors) amplifying differential input signals; a second differential signal amplifier including first and second PMOSFETs (P-type metal-oxide semiconductor field-effect transistors) amplifying the differential input signals; a first feedback resistor including an end commonly connected to drains of the first NMOSFET and the first PMOSFET and the other end commonly connected to gates of the first NMOSFET and the first PMOSFET; a second feedback resistor including an end commonly connected to drains of the second NMOSFET and the second PMOSFET and the other end commonly connected to gates of the second NMOSFET and the second PMOSFET; and a current source providing a bias current for driving the first and second differential signal amplifiers, is provided.

5 Claims, 5 Drawing Sheets

BUFFER AMPLIFIER

CROSS-REFERENCE TO RELATED APPLICATIONS

This application claims priority from Korean Patent Application No. 10-2005-0059150, filed on Jul. 1, 2005, the entire content of which are incorporated herein by reference.

BACKGROUND OF THE INVENTION

1. Field of the Invention

The present invention relates to a buffer amplifier, and more particularly, to a buffer amplifier including a pair of differential N-type metal-oxide semiconductor field-effect transistors (NMOSFETs) and a pair of differential P-type metal-oxide semiconductor field-effect transistors (PMOSFETs) amplifying differential input signals and biased through a feedback resistor so as to operate the pairs of differential NMOSFETs and PMOSFETs in a saturation region.

2. Description of the Related Art

In general, wireless communication systems include various blocks to amplify and filter signals, convert frequencies, and the like. There are buffers of the various blocks receiving and amplifying local oscillator signals generated by local oscillators and outputting the amplified signals to mixers so as to reduce variations in oscillator frequencies caused by effects of loads.

FIG. 1A is a circuit diagram of a differential common-source buffer amplifier using a conventional inductor load.

As shown in FIG. 1A, in a case where inductors L1 and L2 are loads, the inductors L1 and L2 are advantageous in terms of a power consumed for driving a capacitance load. However, inductors occupy wider areas than other elements in an integrated circuit and thus increase the size of the integrated circuit. Also, in a case where the inductors are directly used as loads, a quality factor may be low, and an amplifier sensitively operates with respect to a parasitic capacitance component.

FIG. 1B is a circuit diagram of a conventional differential common-source buffer amplifier using resistor loads.

As shown in FIG. 1B, in a case where resistors $R_{L1}$ and $R_{L2}$ are used as loads, inductors are not directly used as loads. Thus, a size of an integrated circuit can be reduced. However, a bias current $I_{bias}$ is increased to increase a transconductance $g_m$ of an amplifier node including differential transistors MN1 and MN2. Thus, power consumption is increased, and a voltage drops in the resistors $R_{L1}$ and $R_{L2}$. As a result, it is difficult to increase the amplitude of an oscillator signal. Also, a signal distortion occurs due to a limited Slew rate.

FIG. 1C is a circuit diagram of a conventional complementary metal-oxide semiconductor (CMOS) inverter type buffer amplifier. As shown in FIG. 1C, in a case where a PMOSFET MP1 and an NMOSFET MN1 constitute a CMOS inverter type buffer amplifier, a single signal is processed. Thus, the CMOS inverter type buffer amplifier is more disadvantageous in terms of removing a common mode of a power or a signal than the differential common-source buffer amplifier processing differential signals. In particular, a greater noise than the signal may exist due to swaying of the power or a harmonic component. Also, it is difficult to design a bias circuit.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a buffer amplifier amplifying differential input signals without distorting the differential input signals at a low power.

According to an aspect of the present invention, there is provided a buffer amplifier including: a first differential signal amplifier including first and second NMOSFETs (N-type metal-oxide semiconductor field-effect transistors) amplifying differential input signals; a second differential signal amplifier including first and second PMOSFETs (P-type metal-oxide semiconductor field-effect transistors) amplifying the differential input signals; a first feedback resistor including an end commonly connected to drains of the first NMOSFET and the first PMOSFET and the other end commonly connected to gates of the first NMOSFET and the first PMOSFET; a second feedback resistor including an end commonly connected to drains of the second NMOSFET and the second PMOSFET and the other end commonly connected to gates of the second NMOSFET and the second PMOSFET; and a current source providing a bias current for driving the first and second differential signal amplifiers.

The first NMOSFET and the first PMOSFET may operate in a saturation region through the first feedback resistor, and the second NMOSFET and the second PMOSFET may operate in the saturation region through the second feedback resistor.

An intensity of the bias current may vary according to a digital control signal input from an external source to the current source.

The current source may include: a plurality of auxiliary current sources outputting a current having a predetermined intensity; a current mirror circuit outputting the bias current using the current provided from the plurality of auxiliary current sources; and a plurality of switches respectively connected to the plurality of auxiliary current sources in series and turned on and off according to the digital control signal so as to selectively provide the current output from the plurality of auxiliary current sources to the current mirror circuit.

The current mirror circuit may include: a third NMOSFET including a drain commonly connected to sources of the first and second NMOSFETS; and a fourth NMOSFET including a gate connected to a gate of the third NMOSFET and a drain connected to the plurality of auxiliary current sources, the gate and the drain being connected to each other.

The current mirror circuit may include: a third PMOSFET including a drain commonly connected to sources of the first and second PMOSFETs; and a fourth PMOSFET including a gate connected to a gate of the third PMOSFET and a drain connected to the plurality of auxiliary current sources, the gate and the drain being connected to each other. A buffer amplifier may include: a PMOSFET and a NMOSFET that connected to have common gates and common drains; and a first feedback resistor comprising an end commonly connected to gates of the first NMOSFET and the first PMOSFET and another end commonly connected to drains of the first NMOSFET and the first PMOSFET.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE EXEMPLARY EMBODIMENTS

Figure 1A:
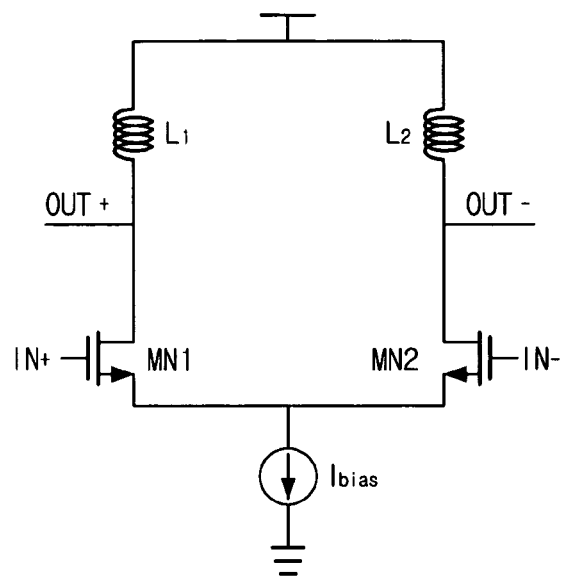
FIG. 1A is a circuit diagram of a conventional differential common-source buffer amplifier using inductors loads.
Figure 1B:
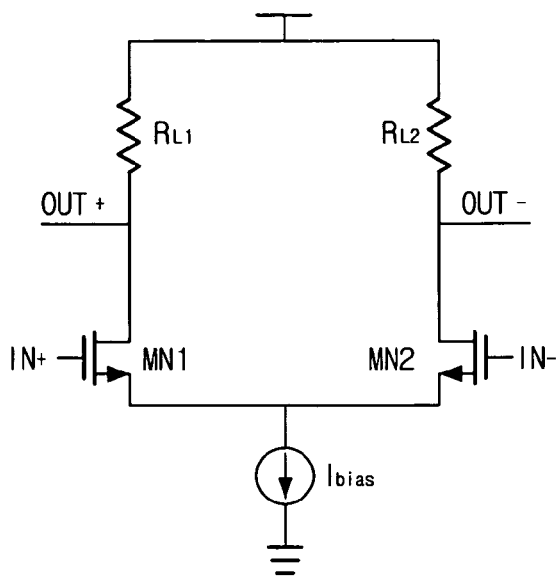
FIG. 1B is a circuit diagram of a conventional differential common-source buffer amplifier using conventional resistor loads.
Figure 1C:
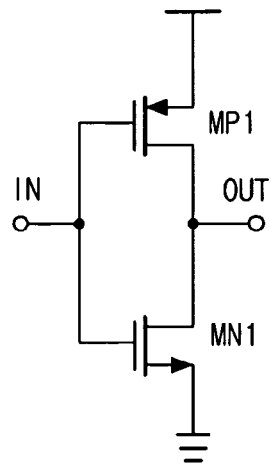
FIG. 1C is a circuit diagram of a conventional CMOS inverter type buffer amplifier.

Certain exemplary embodiments of the present invention will be described in greater detail with reference to the accompanying drawings.

In the following description, same drawing reference numerals are used for the same elements even in different drawings. The matters defined herein are described at a high-level of abstraction to provide a comprehensive yet clear understanding of the invention. Also, well-known functions or constructions are not described in detail since they would obscure the invention in unnecessary detail.

Figure 2:
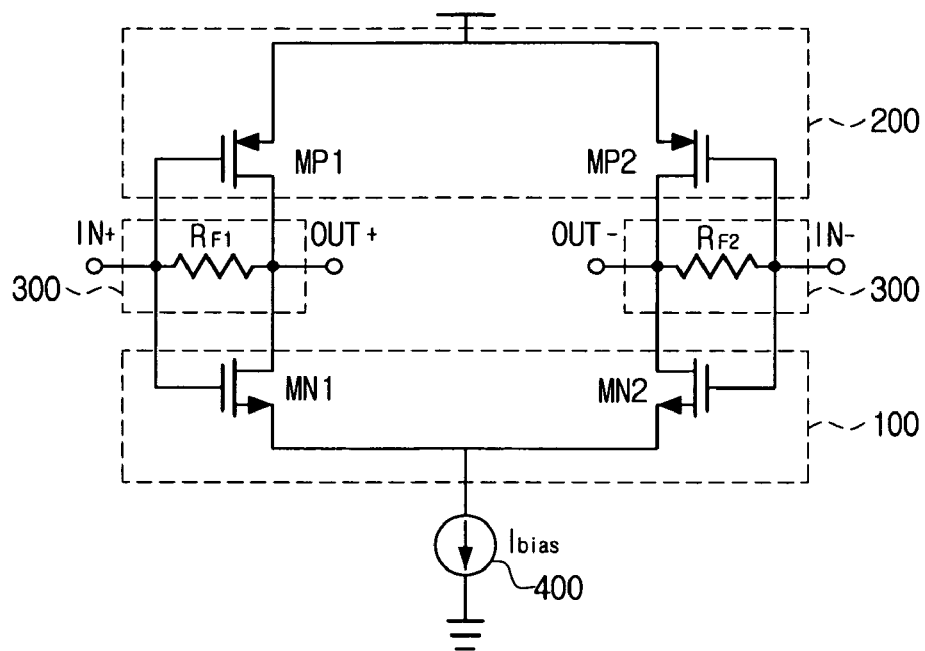
FIG. 2 is a circuit diagram of a buffer amplifier according to an exemplary embodiment of the present invention.

FIG. 2 is a circuit diagram of a buffer amplifier according to an exemplary embodiment of the present invention. Referring to FIG. 2, the buffer amplifier according to the present exemplary embodiment includes first and second differential signal amplifiers 100 and 200, a feedback resistor 300, and a current source 400.

The first differential signal amplifier 100 includes a pair of NMOSFETS MN1 and MN2 receiving and amplifying differential input signals.

Here, sources of the NMOSFETs MN1 and MN2 are commonly connected to the current source 100, gates of the NMOSFETS MN1 and MN2 are respectively connected to differential signal input nodes IN+ and IN−, and drains of the NMOSFETs MN1 and MN2 are respectively connected to drains of PMOSFETs MP1 and MP2 and signal output nodes OUT+ and OUT−.

The second differential signal amplifier 200 includes a pair of PMOSFETs MP1 and MP2 receiving and amplifying the differential input signals.

Here, sources of the PMOSFETs MP1 and MP2 are commonly connected to a voltage power, gates of the PMOSFETs MP1 and MP2 are respectively connected to the differential input signal input nodes IN+ and IN−, drains of the PMOSFETs MP1 and MP2 are respectively connected to the drains of the NMOSFETs MN1 and MN2 and the signal output nodes OUT+ and OUT−.

The feedback resistor 300 includes first and second feedback resistors $R_{F1}$ and $RF_{F2}$. An end of the first feedback resistor $R_{F1}$ is commonly connected to the drains of the NMOSFET MN1 and the PMOSFET MP1, and the other end of the first feedback resistor $R_{F1}$ is commonly connected to gates of the NMOSFET MN1 and the PMOSFET, MP1. An end of the second feedback resistor $R_{F2}$ is commonly connected to the drains of the NMOSFET MN2 and the PMOSFET MP2, and the other end of the second feedback resistor $RF_2$ is commonly connected to gates of the NMOSFET MN2 and the PMOSFET MP2.

Here, a direct current (DC) flowing in the first and second feedback resistors is nearly "0." Thus, direct voltages of the gates of the NMOSFETs MN1 and MN2 and the PMOSFETs MP1 and MP2 are the same as those of the drains of the NMOSFETs MN1 and MN2 and the PMOSFETs MP1 and MP2. As a result, the NMOSFETs MN1 and MN2 and the PMOSFETs MP1 and MP2 are DC biased so as to operate in a saturation region.

Figure 3:
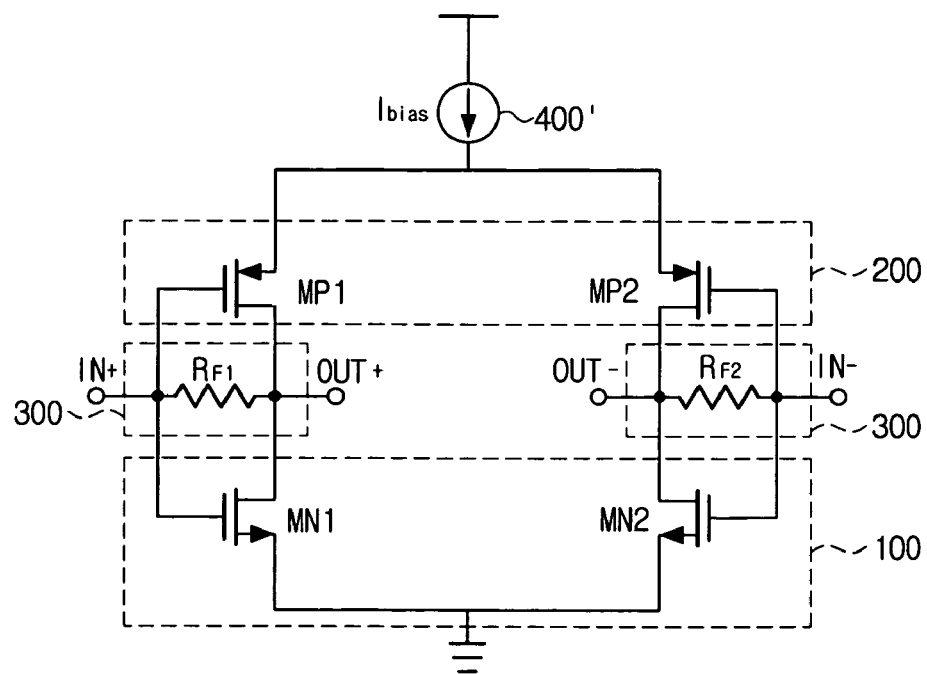
FIG. 3 is a circuit diagram of a buffer amplifier according to another exemplary embodiment of the present invention.

The current source 400 provides a bias current $I_{bias}$ for driving the NMOSFETs MN1 and MN2 and the PMOSFETs MP1 and MP2. In the present exemplary embodiment, the current source 100 is commonly connected to sources of the NMOSFETs MN1 and MN2 of the first differential signal amplifier 100 so as to provide the bias current $I_{bias}$. However, the current source 400 is not limited to such configuration. For instance, alternatively, the current source 400 may be commonly connected to sources of the PMOSFETs MP1 and MP2 of the second differential signal amplifier 200, as shown in FIG. 3.

According to the above-described configuration, when the bias current $I_{bias}$ is provided to the sources of NMOSFETs MN1 and MN2, transconductances of the NMOSFETs MN1 and MN2 are $g_{mn}$. Also, when transconductances of the PMOSFETs MP1 and MP2 are $g_{mp}$, a total transconductance of the buffer amplifier is $g_{mn}+g_{mp}$. Also, a gain Av of the buffer amplifier is $(g_{mn}+g_{mp})\times(1/j\omega C_L)$, where $C_L$ denotes a load capacitance of the buffer amplifier. Thus, a total transconductance and a gain of the buffer amplifier according to the present invention are increased by a bias current more than when transistors are driven.

Also, resistor loads are not used in the present exemplary embodiment. Thus, an input signal can be amplified and output at a low power. As a result, a signal distortion caused by a slew rate limit does not occur. Further, no inductor loads are used, and thus an area of the buffer amplifier can be greatly reduced.

Figure 4:
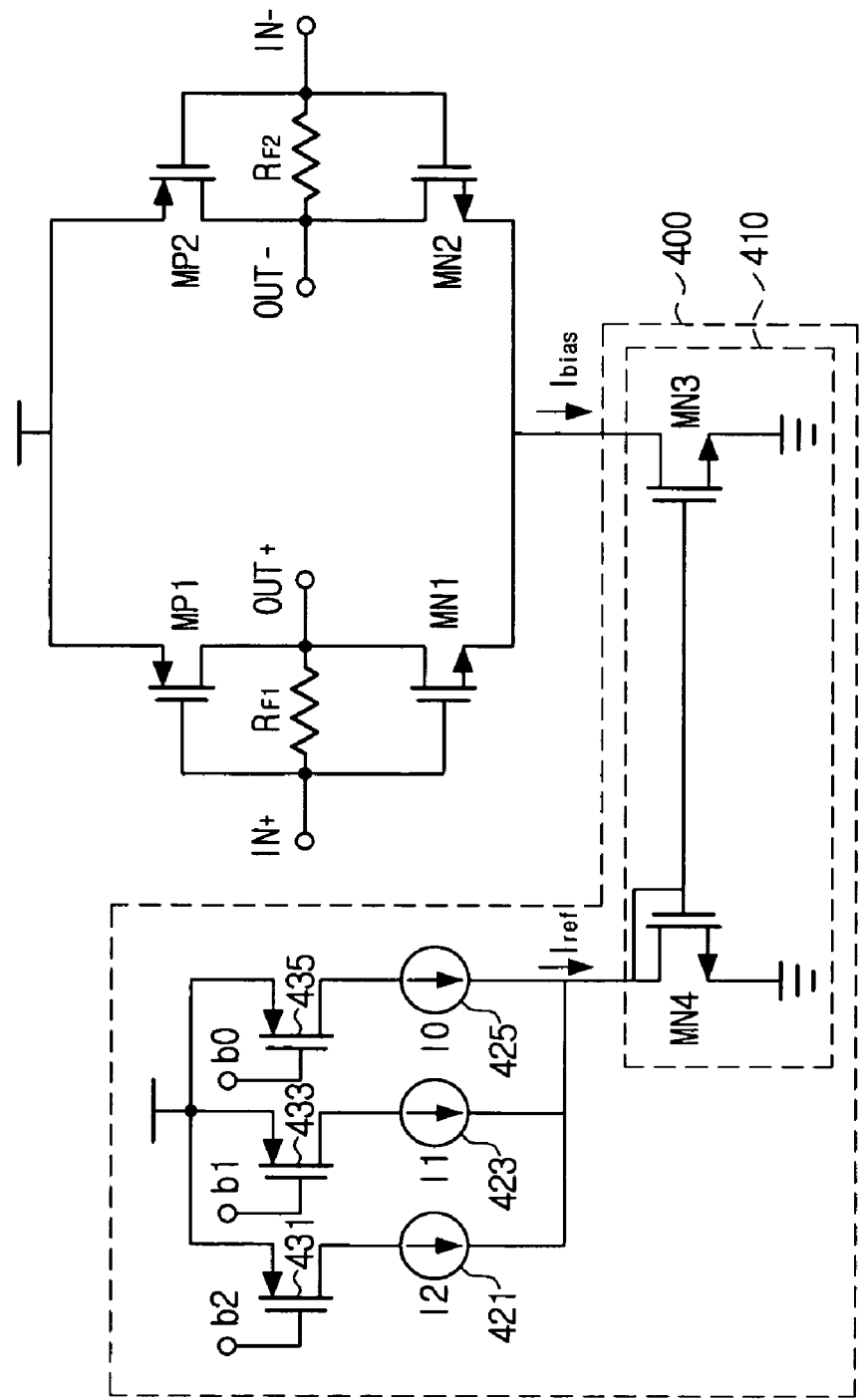
FIG. 4 is a detailed circuit diagram illustrating a current source of the buffer amplifier shown in FIG. 2.

FIG. 4 is a detail circuit diagram illustrating the current source 400 of the buffer amplifier exemplarily shown in FIG. 2. Referring to FIG. 4, the current source 400 includes a current mirror circuit 410, a plurality of switches 431, 433, and 435, and a plurality of auxiliary current sources 421, 423, and 425.

The current mirror circuit 410 includes a pair of NMOSFETs MN3 and MN4 including gates connected to each other and provides a bias current $I_{bias}$ having the same intensity as a current Iref input to a drain of the NMOSFET MN4 to sources of the NMOSFETS MN1 and MN2.

When the plurality of switches 431, 433, and 435 connected to one another in series are turned on, the plurality of auxiliary current sources 421, 423, and 425 provide the current Iref to the drain of the NMOSFET MN4, and the plurality of switches 431, 433, and 435 are turned on and off according to a digital control signal. Thus, according to the present exemplary embodiment, the intensity of the bias current $I_{bias}$ can be adjusted according to the digital control signal for turning on and off the plurality of switches 431, 433, and 435.

For example, b2 is set to a most significant bit (MSB), b0 is set to a least significant bit (LSB), and the digital control signal is "101," the first and third switches 431 and 435 may be turned on, and the second switch 433 may be turned off. In this case, the current Iref input to the drain of the NMOSFET MN4 is $I_2+I_0$. Here, if $I_2=2I_1=4I_0$, the bias current $I_{bias}$ is $5I_0$. Thus, according to the present invention, the current Iref input to the drain of the NMOSFET MN4 can be simply adjusted according to the digital control signal. Thus, the transconductance and gain of the buffer amplifier can be easily changed.

In the present exemplary embodiment, the bias current $I_{bias}$ is divided into 8 steps from "0" to "$7I_0$" to be digitally controlled according to a 3-bit control signal. However, the bias current $I_{bias}$ is not limited to this configuration.

Figure 5:
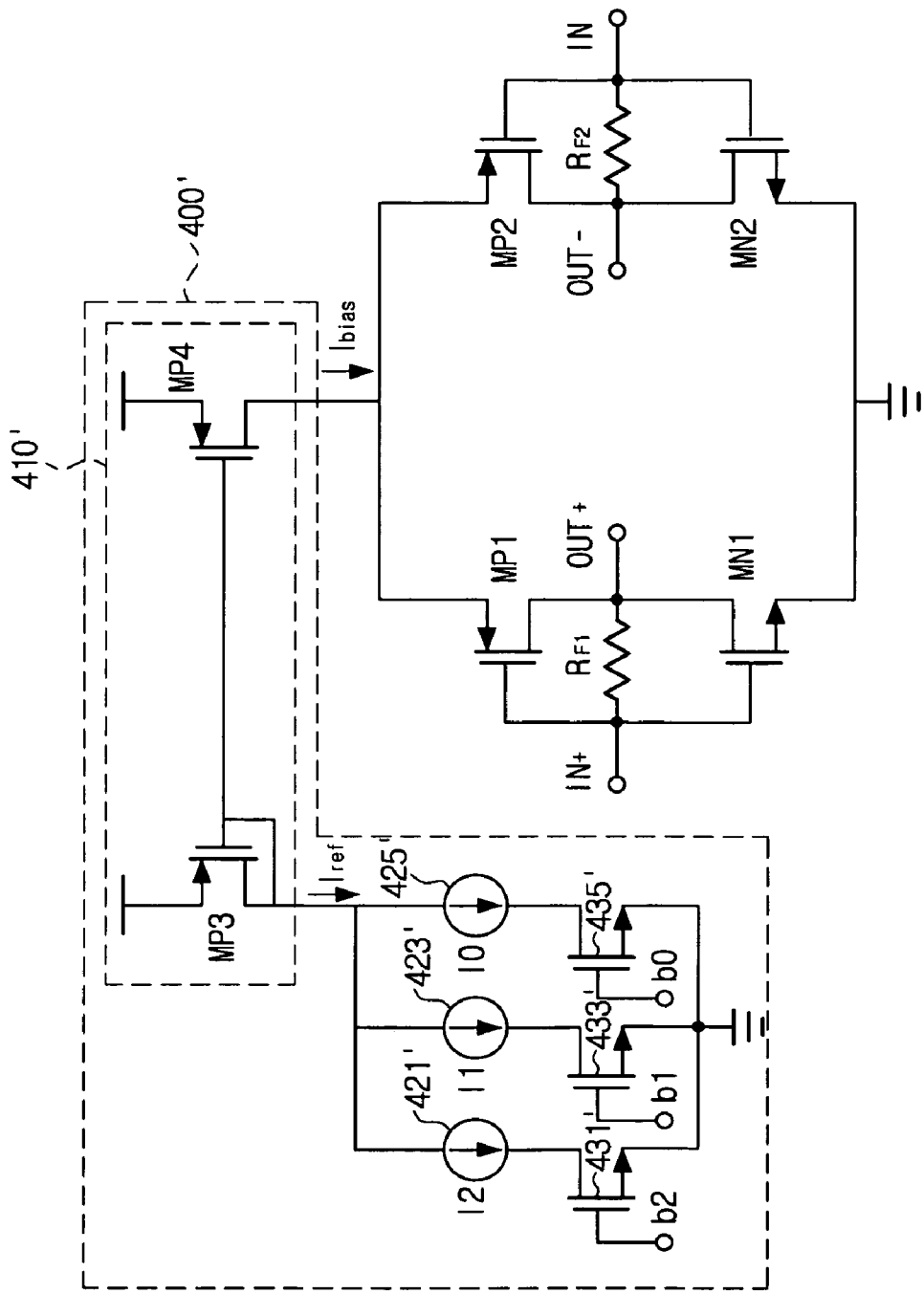
FIG. 5 is a detailed circuit diagram illustrating a current source of the buffer amplifier shown in FIG. 3.

FIG. 5 is a detailed circuit diagram illustrating a current source of the buffer amplifier exemplarily shown in FIG. 3. Referring to FIG. 5, in a case where a current source 400' is connected to the source of the PMOSFETs MP1 and MP2 of the second differential signal amplifier 200, a current mirror circuit 410' may include a pair of PMOSFETs MP3 and MP4 having gates connected to each other.

Operations of a plurality of auxiliary current sources 421', 423', and 425' and a plurality of switches 431', 433', and 435' are the same as those of the plurality of auxiliary current sources 421, 423, and 425 and the plurality of switches 431, 433, and 435 described above, and thus, will not be described herein.

Figure 6A:
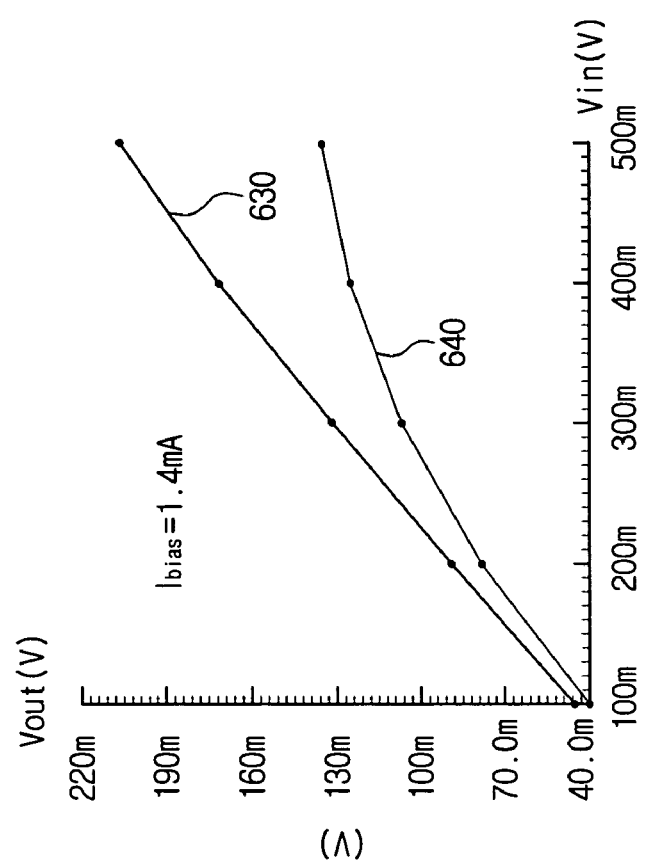
FIGS. 6A and 6B are graphs illustrating results of simulating output voltages with respect to input voltages in a buffer amplifier of the present invention and a conventional common-source buffer amplifier.
Figure 6B:
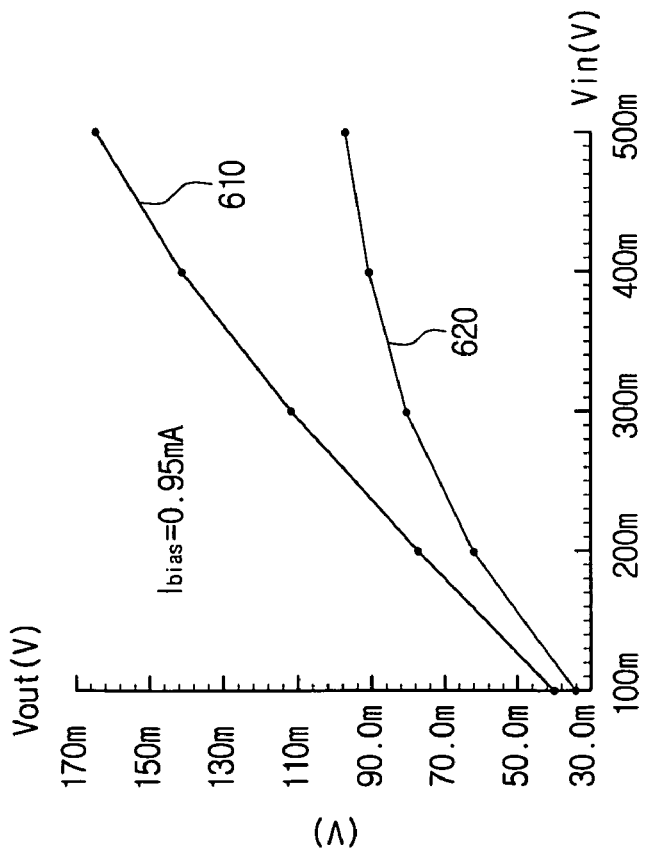

FIGS. 6A and 6B are graphs illustrating results of simulating output voltages with respect to input voltages in the buffer amplifier shown in FIG. 2 and a conventional common-source buffer amplifier.

Horizontal axes of FIGS. 6A and 6B denote intensities of the input voltages, and vertical axes of FIGS. 6A and 6B denote intensities of the output voltages. FIG. 6A illustrates the result of the simulation at a bias current $I_{bias}$ of 0.95 mA, and FIG. 6B illustrates the result of the simulation at a bias current $I_{bias}$ of 1.4 mA. Referring to FIG. 6A, reference numeral 610 denotes a relationship between the input and output voltages in the buffer amplifier shown in FIG. 2, and reference numeral 620 denotes a relationship between the input and output voltages in the conventional common-source buffer amplifier. Referring to FIG. 6B, reference numeral 630 denotes a relationship between the input and output voltages in the buffer amplifier shown in FIG. 2, and reference numeral 640 denotes a relationship between the input and output voltages in the conventional common-source buffer amplifier.

As shown in FIGS. 6A and 6B, an amplification gain of the input voltage of the buffer amplifier shown in FIG. 2 is higher than an amplification gain of the input voltage of the conventional common-source buffer amplifier. The amplification gain is not saturated with respect to a great input signal but the gain is kept linear.

As described above, according to the present invention, resistor loads are not used. Thus, an input signal can be amplified and output at a low power. Also, a signal distortion caused by a slew rate limit does not occur. In addition, inductor loads are not used. Thus, an area of a buffer amplifier can be greatly reduced.

Moreover, an intensity of a bias current can be simply adjusted according to a digital control signal. Thus, a transconductance and a gain of the buffer amplifier can be easily changed.

Furthermore, the transconductance and an amplification gain of the buffer amplifier can be increased by bias currents having the same intensity. The amplification gain is not saturated with respect to a great input signal, and an output amplified signal can be kept linear.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A buffer amplifier comprising:
   a first differential signal amplifier comprising first and second N-type metal-oxide semiconductor field-effect transistors (NMOSFETs) which amplifies differential input signals;
   a second differential signal amplifier comprising first and second P-type metal-oxide semiconductor field-effect transistors (PMOSFET) which amplifies the differential input signals;
   a first feedback resistor comprising an end commonly connected to drains of the first NMOSFET and the first PMOSFET and another end commonly connected to gates of the first NMOSFET and the first PMOSFET;
   a second feedback resistor comprising an end commonly connected to drains of the second NMOSFET and the second PMOSFET and another end commonly connected to gates of the second NMOSFET and the second PMOSFET; and
   a current source which provides a bias current for driving the first and second differential signal amplifiers.

2. The buffer amplifier of claim 1, wherein the first NMOSFET and the first PMOSFET operate in a saturation region through the first feedback resistor, and the second NMOSFET and the second PMOSFET operate in the saturation region through the second feedback resistor.

3. The buffer amplifier of claim 1, wherein an intensity of the bias current varies according to a digital control signal input from an external source to the current source.

4. The buffer amplifier of claim 3, wherein the current source comprises:
   a plurality of auxiliary current sources which output a current having a predetermined intensity;
   a current mirror circuit which outputs the bias current using the current provided from the plurality of auxiliary current sources; and
   a plurality of switches respectively connected to the plurality of auxiliary current sources in series and turned on and off according to the digital control signal so as to selectively provide the current output from the plurality of auxiliary current sources to the current mirror circuit.

5. The buffer amplifier of claim 4, wherein the current mirror circuit comprises:
   a third NMOSFET comprising a drain commonly connected to sources of the first and second NMOSFETS; and
   a fourth NMOSFET comprising a gate connected to a gate of the third NMOSFET and a drain connected to the plurality of auxiliary current sources, the gate and the drain being connected to each other.

\* \* \* \* \*